United States Patent [19]

Chang et al.

[11] 4,011,461
[45] Mar. 8, 1977

[54] PIPELINED UNIVERSAL BUBBLE LOGIC ARRAY

[75] Inventors: Hsu Chang, Yorktown Heights, N.Y.; Tien C. Chen, San Jose, Calif.; Share-Young Lee, Lake Mohegan, N.Y.

[73] Assignee: International Business Machines Corporation, Yorktown Heights, N.Y.

[22] Filed: July 17, 1975

[21] Appl. No.: 596,932

Related U.S. Application Data

[63] Continuation of Ser. No. 488,876, July 15, 1974, abandoned.

[52] U.S. Cl. .................... 307/88 LC; 340/174 TF
[51] Int. Cl.$^2$ ................ G11C 11/14; H03K 19/168
[58] Field of Search .............. 340/174 TF, 174 VB; 307/88 LC

[56] References Cited

UNITED STATES PATENTS

| | | | |
|---|---|---|---|
| 3,765,004 | 10/1973 | Caron | 340/174 TF |
| 3,798,607 | 3/1974 | Minnick et al. | 340/174 TF |
| 3,866,191 | 2/1975 | Minnick et al. | 340/174 TF |

*Primary Examiner*—James W. Moffitt
*Attorney, Agent, or Firm*—Pollock, Vande Sande & Priddy

[57] ABSTRACT

A bubble logic array with n data inputs for performing any Boolean (or switching) logic function. Each of the data inputs comprises binary information in the form of the presence or absence of discrete bubbles. The logic function is performed by the propagation, channeling, and interaction of the bubbles themselves. The particular logic function performed by the array may be fixed by permanent connections of selective control inputs to bubble generators. Alternatively, a universal logic array may be provided by using a further $2^n$ bubble inputs as controls to separately personalize the array. In this manner, the logic function performed by the array may be varied with each set of controls to achieve dynamically alterable logic. When the data inputs each comprise an input bubble pattern the logic array in either the fixed form or the alterable form is capable of pipelining operations, producing one meaningful output at every bit cycle.

24 Claims, 6 Drawing Figures

PIPELINED UNIVERSAL BUBBLE LOGIC ARRAY

This is a continuation, of application Ser. No. 488,876, filed July 15, 1974 now abandoned.

FIELD OF THE INVENTION

This invention relates to logic devices and more particularly relates to devices in a sheet of uniaxial magnetic material, for performing logic functions on data in the form of single wall magnetic domains, popularly known as bubbles.

BACKGROUND OF THE INVENTION

Thin sheets of certain types of uniaxial magnetic material are capable of supporting single wall magnetic domains magnetized in a direction opposite to that of the adjacent region. Furthermore, the single wall domains, or bubbles, can, under proper conditions, be generated, propagated, annihilated and sensed.

One particular method of propagating these bubbles, called the field-access method, utilizes a rotating in-plane magnetic field. This field, cooperating with a patterned layer of soft magnetic material, preferably overlying the material supporting the bubbles, will cause the bubbles to propagate along a path defined by the pattern and in synchronism with the rotating magnetic field. This characteristic, plus the interaction of bubbles with each other has led to the development of devices for performing logic operations with the bubbles. More particularly, these devices rely upon the mutual repulsion between adjacent bubbles to signal, by the selective movement of one bubble, the presence of an adjacent bubble. Logic functions are performed in a binary fashion, for example, by assigning the binary value 1 or 0 to the presence or absence of a bubble respectively. Since the bubbles move synchronously, the absence of a bubble, called a void can also be said to move synchronously. Thus a serial stream of bubbles and voids may represent data which can be considered binary. With two such streams, logical functions may be performed with an output stream representing the logical combination of the input streams. One form of bubble AND circuit is shown in Danylchuk et al, U.S. Pat. No. 3,651,496. Another illustration of an AND-/OR gate and an EXCLUSIVE OR gate can be found in an article by Sandfort et al, entitled "Logic Functions for Magnetic Bubble Devices," appearing in *IEEE Transactions on Magnetics*, pages 358 through 360 (September 1971). Of course, as illustrated in each of the foregoing references, each distinct logic function requires a different overlay pattern. While this differentiation is not fatal to the utility of these devices, it is inflexible and tends to increase design cost. It is desirable to achieve an universal logic device. That is, a device which is capable of performing one of many, or all, possible logic functions. The desirable universal logic device could be personalized, in the final manufacturing stages, to perform one of the many logic functions it was capable of. By postponing the personalizing step to the interconnection phase of manufacturing, the device has even more desirable characteristics in that the manufacture of all logic devices would be identical. Further postponement is possible if dynamically alterable logic can be implemented as will be described herein.

Personalizable logic devices, with the foregoing characteristics, have also been discussed in the semi-conductor field. In particular Henle et al, in an article entitled "Structure Logic," appearing in the 1969 Fall Joint Computer Conference Proc. (pp. 61–68), discussed read-only storage which is just a systematic personalizable logic array. Fleisher et al, in an article entitled "The Writeable Personalized Chip," appearing in the June 1970 issue of *Computer Design*, at pages 59 through 66 explore the logical requirements for a semiconductor universal logic device.

A bubble logic device which is minimally personalizable is illustrated in Morrow et al, U.S. Pat. No. 3,543,255. In particular, see FIG. 31 and column 6, related thereto. Morrow et al disclose a three-input device comprising input channels A, B and C. The device is capable of producing streams of bubbles on output channels A, B and C wherein the data on each output channel is identical to the data on the input channel or, a single output channel with the output equal to A.B.C (where . represents AND). This device is minimally personalizable since the device is capable of either producing a logical AND between all of its inputs or performing no logic function at all. It is apparent that the Morrow et al disclosure is quite removed from the desire for a logic array capable of performing a wide variety of logical functions.

The foregoing statement applies, with even greater force, to the specific logical circuits including the AND, AND/OR and EXCLUSIVE OR gates previously referred to. Finally, the Fleisher et al article, while dealing with the logical requirements for a semiconductor logic array, provides little, if any, insight into the specific requirements for logical bubble devices. Dynamic personalization is difficult with semiconductor devices because of the volatility of control information upon power cutoff. Bubble based devices, in contrast, do not lose personality as long as the bias field remains. A "Magnetic Logic Arrangement" disclosed in U.S. Pat. No. 3,541,522, describes a universal logic cell which are controlled by multiple conductor lines and perform different logic functions in response to different control pulses. The cells are basically two-input cells. A multiplicity of these cells could be considered a logic array. However, the many conductor lines are not amenable to LSI manufacture, nor are the conglomeration of two input cells amenable to high-level logic functions nor pipelined operation. The first bubble logic device which is amenable to array logic is described in a copending patent application Ser. No. 351,665 filed 4/16/73) now published application B 351,665 published on Jan. 28, 1975 under the Trial Voluntary Protest Program. The device is based on the counting of bubbles to execute logic in symmetrical switching functions, while the present invention is based on the logic arrangement of more conventional logic connective components. In contrast to the application Ser. No. 351,665, the present invention needs no clear operation after each logic operation, and its personalization data are in parallel rather than in series, hence it lends itself more readily to pipelined operation.

SUMMARY OF THE INVENTION

The present invention provides a bubble logic array for performing a logic function on a set of input data which appears in the form of the presence or absence of discrete bubbles. The logic array is capable of performing any one of all possible logic functions on the input data available. Furthermore, the particular logic function performed may be permanently selected by appropriately connecting control inputs. These control inputs may also take the form of controls on the propagation paths for discrete bubbles. In one embodiment, each of the control inputs which require a "one" identifying the function to be performed, is connected to a bubble generator. The other control inputs are not connected to a bubble generator. Alternatively, each of the control inputs is connected to a bubble generator and a separate control means determines whether or not bubbles will be allowed to enter the control inputs. In this manner, the logic function to be performed can be determined by operation of the control means.

Alternatively, the control inputs are derived from a memory such as a bubble register or other logic elements in a system.

The data inputs to the logic array are decoded, by a bubble-bubble decoding means which has a plurality of outputs, one for each possible logical combination of the inputs. In general, if there are n inputs, there will be $2^n$ decoder output paths.

Each separate output path from the decoder forms one input to a logic means, there being a separate logic means for each of the decoder outputs. In addition, one of the control inputs forms the other input to the logic means. The logic means comprises an AND gate.

Since the bubbles, which are the information carriers, move synchronously with respect to the rotating magnetic field, the information represented by the bubbles is time dependent. Therefore, for the decoder to produce the proper output, as well as for any of the AND gates to produce the intended output, the inputs may be properly synchronized. To this end, delay means is employed in the propagation paths from the decoder output to the logic means, as well as in the decoder input, so that related information arrives simultaneously, as is necessary for proper functioning.

Finally, the output of each of the AND gates is logically combined in an OR gate to provide the desired logic function of the data input.

Thus, for a logic array which has some of its control inputs connected to bubble generators, and other of its control inputs not connected to bubble generators, the logic array will perform a function which is defined by the particular control inputs which are connected to bubble generators. Alternatively, providing bubble inputs to all the control inputs of the logic array allows the particular function to be performed to be determined by the configuration of bubbles presented to the control input. The foregoing is thus a universal logic array which is capable of providing any logical output function of the inputs.

By presenting data input to the logical array in the form of streams of bubbles and by likewise providing streams of control bubbles to the control inputs, the universal logic array of this invention is thus amenable to pipelining operations. Because the data input experiences a different time delay in reaching the AND gates, than does the control inputs, the control inputs must be delayed, in time, with respect to the related data inputs.

BRIEF DESCRIPTION OF THE DRAWINGS

The present invention will be explained with reference to the accompanying drawings in which.

DETAILED DESCRIPTION OF THE INVENTION

Figure 1:
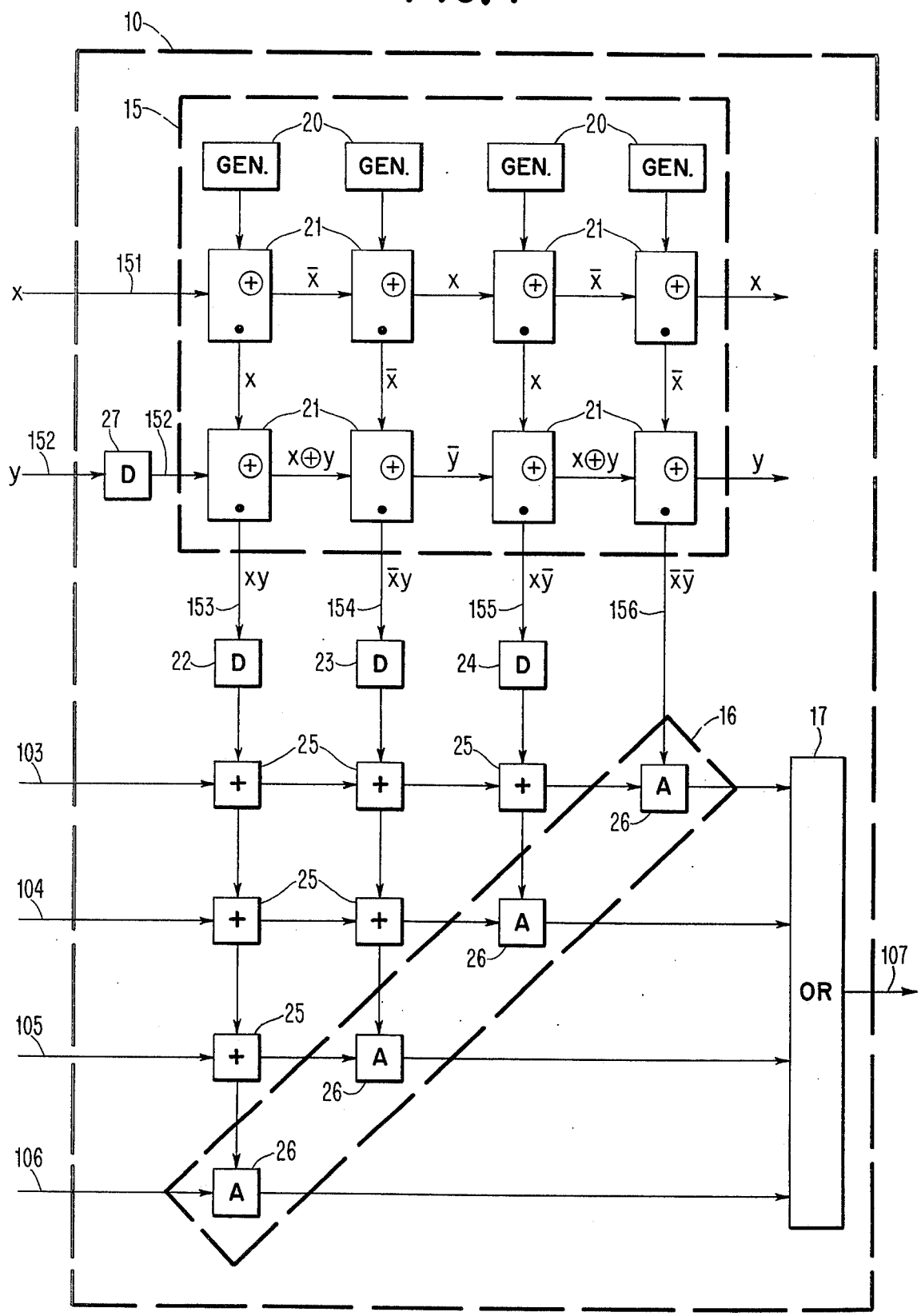
FIG. 1 is a block diagram of a bubble universal logic array in accordance with the invention.

The universal logic array 10 is illustrated in FIG. 1. It comprises a bubble-bubble decoder 15, a logic means 16 and delay means 22–24 connecting the decoder outputs to the logic means. For determining the logic function to be performed, control inputs 103–106 are provided. The output is available at path 107. Before describing the operation and detailed arrangement of the logic array as shown in FIG. 1, a brief theoretical background is in order.

Any switching function $f(x_1, x_2, \ldots, x_n)$ can be expressed in the form of the standard sum of products (known as minterms):

$$f(x_1, x_2, \ldots, x_n) = a_0 \bar{x}_1 \bar{x}_2 \ldots \bar{x}_n + a_1 x_1 \bar{x}_2 \ldots \bar{x}_n + \ldots a_{2^n-1} x_1 x_2 \ldots x_n \quad (1)$$

In equation (1) $a_0 = f(0, 0, \ldots 0)$, $a_{2^n-1} = f(1, 1, \ldots, 1)$, etc.

The values of these coefficients are determined by the function $f$ only. When specified, a set of these coefficients $(a_0, a_1, \ldots, a_{2^n-1})$ uniquely define the function $f$. These coefficients are called the personalization coefficients of the switching function. Our array is capable of realizing the above function; and, since it is amenable to varying the coefficients, it is a universal re-writeable logic array.

FIG. 1 is a functional block diagram representation of a two input universal logic array in accordance with the principles of our invention. In the course of this description we will indicate, where necessary, the changes that are necessary for the general case n input array.

Each of the functional blocks shown in FIG. 1 will be specifically identified. Since these functional blocks operate on discrete bubbles the interconnection paths 151, 152, 153-155, etc., are bubble propagation paths. Bubble-bubble decoder 15 accepts data input, at paths 151 and 152. The decoder then produces bubbles on output paths 153 through 156 each representing a different logical combination of the input data. For a two input device this requires four output paths. In general, for an n input device, $2^n$ output paths are required. Each output path produces a separate minterm necessary to making up the logical output.

For instance, if we designate input path 151 as accepting input data $x$, an input path 152 as accepting input data $y$, output path 153 can produce the minterm $x \cdot y$, output path 154 can produce the minterm $\bar{x} \cdot y$, output path 155 produces the minterm $x \cdot \bar{y}$ and finally output path 156 produces the minterm $\bar{x} \cdot \bar{y}$. The manner in which each of the minterms is developed will now be discussed.

Bubble decoder 15 includes eight conjugate EXCLUSIVE OR/AND gates. Each gate 21 accepts two inputs and produces two outputs, the first output is the EXCLUSIVE OR combination of the inputs and the second output is the AND combination of the inputs. As shown in FIG. 1 the horizontally directed output is the EXCLUSIVE OR output and the vertically directed output is the AND output. An example of a permalloy pattern for providing such an EXCLUSIVE OR/AND gate is reproduced in FIG. 2. The gates 21 are arranged in two rows, of four gates each. The gates in each row are serially interconnected. The first gate in the upper row receives the data $x$ as one input. A second input to each of the gates in the upper row is provided by bubble generators 20. Thus, these gates continuously receive a ONE on their input connected to these generators. Since the first gate in the upper row receives an $x$ input and a ONE input, its EXCLUSIVE OR output will be $\bar{x}$. Likewise, the second gate in the upper row receives $\bar{x}$ and ONE and its EXCLUSIVE OR output represents $x$. As expected the AND output of each gate is identical to its horizontal input.

The $y$ input, on path 152, is delayed by delay means 27. This delay is equivalent to delay a bubble encounters in traversing any of the gates 21. Therefore, the $x$ input to the first gate in the second row will arrive at the same instant as the corresponding $y$ input since each are delayed by a unit delay. Since the vertical output of the first gate in the second row is the AND product of its inputs, path 153 will carry the logical combination $x.y$. In a similar fashion each of the other outputs of the gates in the second row of the decoder can be determined.

The outputs of each of the gates 21 in the second row of the decoder are fed to a logic means 16. Some of the outputs traverse delay means 22, 23 and 24 while the output path 156 has no delay means.

The logic means 16 comprises an AND gate for each of the outputs of the bubble decoder. These AND gates 26 can employ a permalloy propagation pattern similar to the AND gate shown in FIG. 3.

In order to personalize the array a plurality of control inputs 103 through 106 are provided. It is convenient to arrange all the control inputs to be simultaneously effective. Since the bubble decoder outputs representative of the minterms appear at different times, the delay means 22, 23 and 24 are inserted in bubble propagation paths 153, 154 and 155 to equalize the delay in the propagation paths from the inputs 151 and 152 to the inputs of the logic means 16. Since each of the EXCLUSIVE OR/AND gates 21 are identical, each introduces identical periods of delay. For that reason, one can easily determine that the bubble decoder output on propagation path 156 will appear three unit delays after the bubble decoder output on propagation path 153, in response to the identical input. For that reason, delay means 22 introduces a delay equal to that in traversing three gates 21. For the same reasons, delay means 23 introduces a delay equal to that of traversing two gates 21 and finally, delay means 24 introduces a delay equivalent to that in traversing one gate 21.

A review of FIG. 1 makes it apparent that the personalization bubbles must be delayed by $2^n + n - 1$ units with respect to the input data so that the personalization bubble or void and minterm bubble or void arrive simultaneously at the AND gate 26, when n equals the number of inputs to the array and a unit delay is defined as the delay in traversing a gate 21.

As is illustrated in FIG. 1 the propagation path 156 from bubble decoder 15 goes directly to AND gate 26 of the logic means 16. In contrast, however, the bubble decoder outputs on propagation paths 153 through 155 traverse one or more of cross over units 25. The cross over units 25 make use of the propagation patterns illustrated in the afore-mentioned Morrow et al patent.

With the apparatus illustrated in FIG. 1, bubbles, representing input data provided simultaneously on propagation paths 151 and 152 will, in the presence of the rotating magnetic field H, produce a plurality of minterm outputs on paths 153 to 156 which will arrive simultaneously at the AND gates 26.

Therefore, with the simultaneous application, on control inputs 103 through 106 of selected bubbles representative of the particular logic function to be performed, the logic array illustrated in FIG. 1 can provide any logical combination of its inputs. Thus, the presence or absence of a bubble on control path 103 will control the minterm $\bar{x}.\bar{y}$, propagation path 104 controls the minterm $x.\bar{y}$, control path 105 controls the minterm $\bar{x}.y$ and control path 106 controls the minterm $x.y$.

Figure 4:
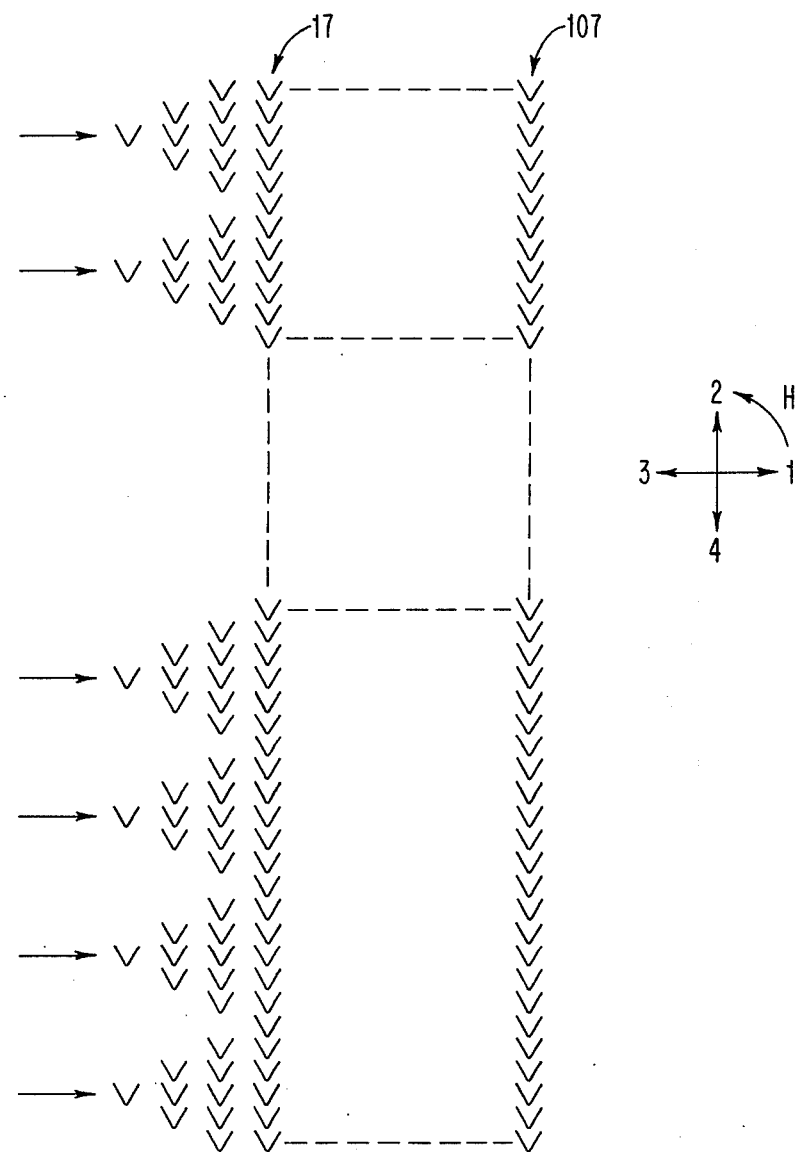
FIG. 4 is a plan view of an OR gate that may be used in FIG. 1.

Finally, each of the outputs of the logic means 16 is combined in an OR gate 17 to produce the final output on propagation path 107. A suitable form for OR gate 17 is illustrated in FIG. 4.

The four control inputs are sufficient for a two input logic array. In general, for an $n$ input logic array, $2^n$ control inputs are required, as well as $2^n$ logic elements.

In one embodiment, the universal logic array illustrated in FIG. 1 is personalized by selectively connecting the control inputs 103 to 106 to bubble generators. To this end, for instance, control input 103 would be connected to a bubble generator and control inputs 104 through 106 would not. Under these conditions, the logic array would perform the logical function $x.y$. Clearly, any logical combination of the inputs could be provided by selectively connecting one or more of the control inputs lines 103 to 106 to bubble generators.

Figure 3A:
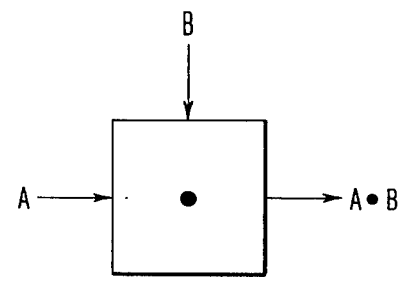
FIGS. 3A and 3B are a block diagram and plan view of an AND gate that may be used in FIG. 1.

In another embodiment, the logic array may be personalized by control data. To this end, each of the control inputs 103 through 106 are connected to a bubble generator through a control means. The control means, in response to a signal, allows a bubble to proceed down the control path. Thus, in one case, for instance if the control line associated with control path 103 were initiated, with the control means associated with control paths 104 through 106 uninitiated, the logic function would then produce $x.y$. Of course, any other combination of control signals could enable a logic array to perform any selected logic function. Control means to perform this selective propagation of bubbles may take many forms, one of which is illustrated in FIG. 3A of U.S. Pat. No. 3,701,125.

Alternatively, the control propagation paths may be connected to a bubble register, or a plurality of bubble registers to alter the logic function effected by the array in accordance with the data stored in the register or registers. It should also be apparent to those skilled in the art that the control propagation paths 103 through 106 could be connected to the output of other logic devices in the system to control the personalization of the array.

Finally, the input data on propagation paths 151 and 152 may comprise a stream of bubbles for each of the input paths. In this manner the universal logic array illustrated in FIG. 1 is then capable of performing pipelining operations. That is, the personalization of the array can be varied for each different set of input data presented thereto. Thus, the same array may be used to perform different logic functions on different sets of input data in accordance with different control inputs.

The pipelining capabilities of the logic array are significant even in the absence of the capability of varying the personalization of the array. Consider a set of data arriving at the inputs 151 and 152 at time 0. Since the bubbles, which represent the information, move synchronously with the in-plane rotating magnetic field we can define a bit cycle as identical with a cycle of the magnetic field. With a continuous stream of data, a new set of data is input in each bit cycle. Once operation has continued for sufficient time for the first set of input data to produce an output a new output is produced at the same rate, i.e., once per bit cycle. Thus at time $D_T$ (where $D_T$ represents the delay between input and output) an output is produced corresponding to the input at time 0. If a second set of input data is presented at time B (where B represents a bit cycle) a corresponding output will be available at $D_T + B$.

Figure 2A:
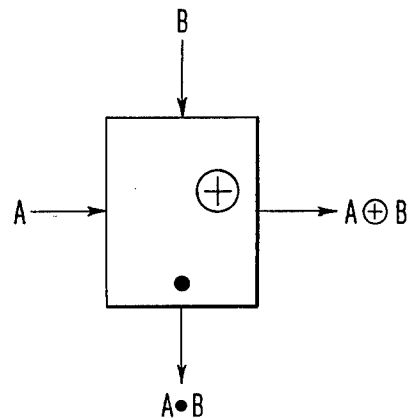
FIGS. 2A and 2B are a block diagram and plan view of a conjugate EXCLUSIVE OR/AND gate that may be used in FIG. 1.
Figure 2B:
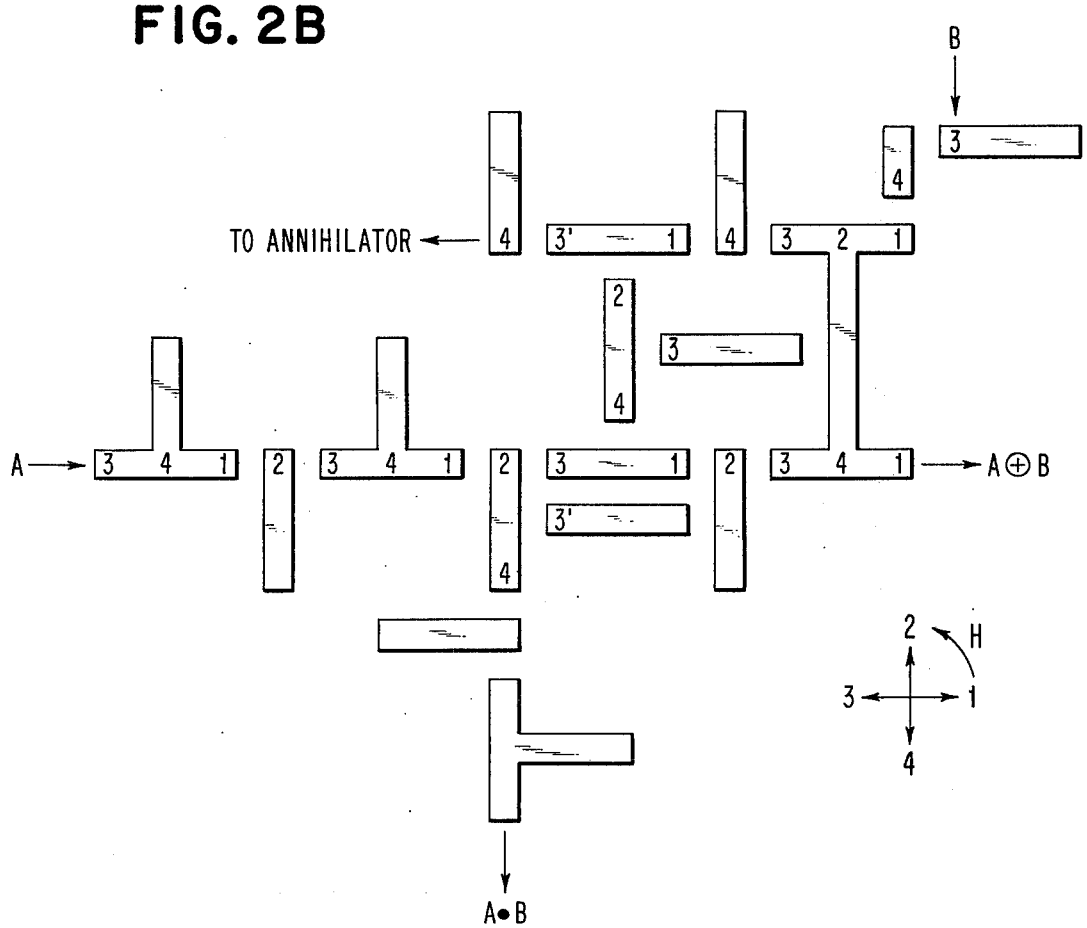

FIGS. 2A and 2B illustrate respectively a block diagram and schematic representation of a permalloy pattern for a conjugate EXCLUSIVE OR/AND gate which may be used to satisfy the requirements for the gate 21 in the bubble decoder 15 of FIG. 1. FIG. 2A shows that the gate is provided with inputs A and B and has two outputs, an EXCLUSIVE OR output A ⊕ B and an AND output A.B.

FIG. 2B illustrates a suitable pattern for effecting this function in a rotating magnetic field H. The four different phases of the rotating magnetic field are illustrated in FIG. 2B. As is well known in the art, the rotating magnetic field introduces local perturbations in the field sensed by any particular bubble which causes the bubble to propagate. The direction of propagation is dependent upon the permalloy pattern and FIG. 2B illustrates one pattern which will produce the effect required by the block diagram of FIG. 2A. Inputs at A and B are illustrated and it is assumed that the bubbles enter the gate at a time when the field is in its phase 3.

Focusing on a bubble which is introduced at A it will propagate along the permalloy pattern at times in synchronism with the rotating magnetic field such that it steps from one numbered position to the next with the rotation of the field. Thus, a bubble entering at A would trace the path 3-4-1-2, etc., to the EXCLUSIVE OR output at the right. Similarly, a bubble entering at B would trace the path 3-4-1, etc., to the same output. However, if bubbles were simultaneously introduced at paths A and B the bubble at path A would traverse the path 3-4-1-2-3-4-1-2-3'-4 to the AND output A.B. The bubble entering at B would follow the path 3-4-1-2-3-4-1-2-3'-4 to the annihilator at the left. Neither bubble would exit at the EXCLUSIVE OR output. The reason for this is that when the bubbles reach their closest 2—2 positions, the mutual repulsion experienced by the bubbles will displace them to the locations 3'—3' and as the field rotates to its fourth phase they will follow the deviated paths. Thus, a bubble will exit at the EXCLUSIVE OR output only if it is the only bubble in that time slot in the gate. If there are two bubbles in the same time slot in the gate one will exit at the AND output, the other will be annihilated.

Figure 3B:
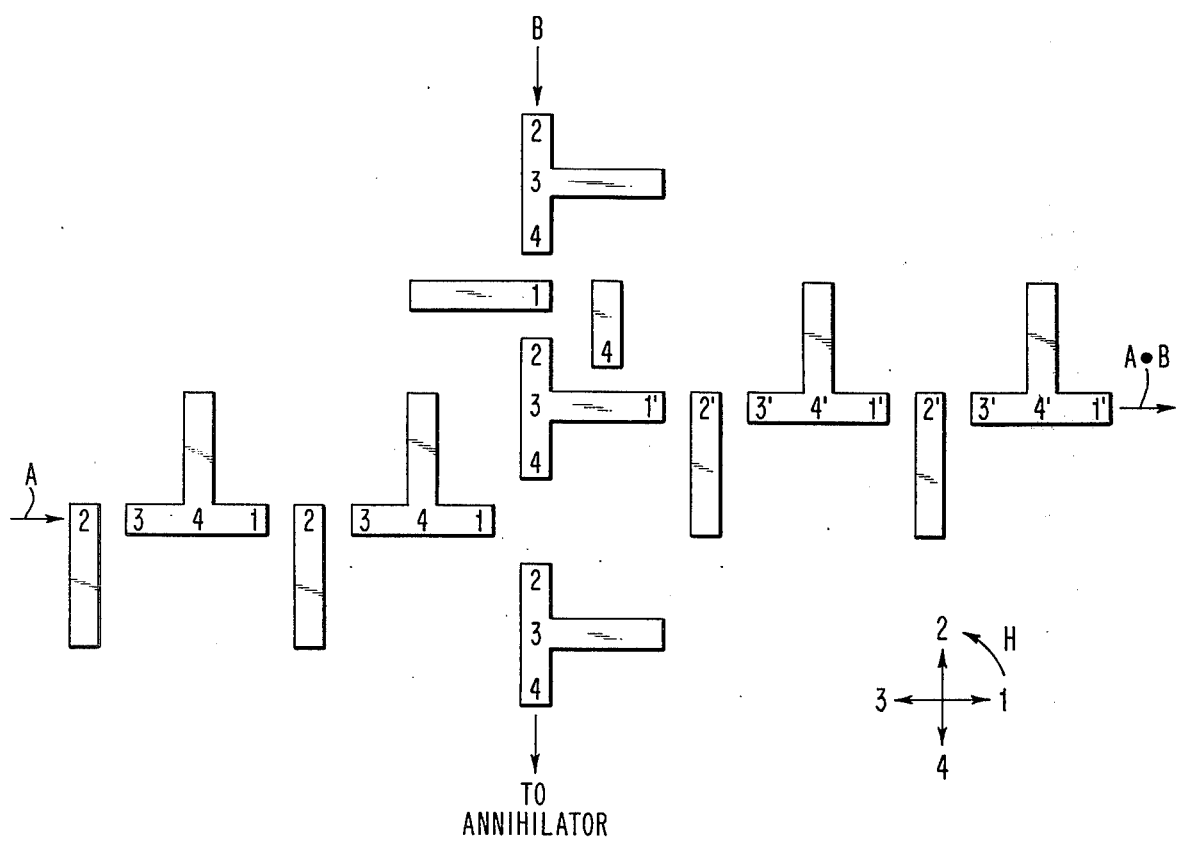

FIGS. 3A and 3B illustrate an AND gate which is suitable for the logic means 16, of FIG. 1, such as AND gate 26. Functionally the gate is similar to that illustrated in FIG. 2 although the pattern is varied to accommodate the AND output at a different relative position to the inputs. Assuming the entrance of only a single bubble in a particular time slot in the gate it will follow the unprimed paths to the annihilator. This is true for bubbles entering either at A or B. However, if bubbles are introduced at A and B simultaneously, the bubble introduced at B will follow the primed path to the AND output while the bubble introduced at A will follow the path to the annihilator. Thus, an output is produced only upon the joint occurrence of simultaneous inputs at A and B.

The cross-over arrangement 25 may take the form illustrated by Morrow et al in U.S. Pat. No. 3,543,255.

The OR gate 17 may take the form illustrated in FIG. 4 which reproduces, in part, the illustration in IBM Technical Disclosure Bulletin, Volume 16, No. 6, p. 1807 (Nov. 1973) by H. Chang. Detailed explanation of the operation of the device is believed unnecessary. OR gate 17 operates in a different environment than the other gates. OR gate 17 will never experience multiple bubbles in the same time slot. This is because the minterms are mutually exclusive, i.e., only one minterm is non-zero at anytime. Although FIG. 4 illustrates a V-pattern the implementation could use the T and I bars illustrated in FIGS. 2B and 3B as well.

Those skilled in the art will readily be able to employ different patterns for the AND gates 21, 26 and 17 than those shown in the accompanying drawings. It should be readily apparent that the present invention is not restricted to the use of any particular type of pattern for effecting any of the basic logic functions.

In summary, the logic array illustrated in FIG. 1 can be personalized by the selective application of control inputs. Logic array may be permanently personalized by selectively connecting different ones of the control inputs to bubble generators. Alternatively, using a control means such as a current loop to control the propagation of bubbles from a bubble generator into the control inputs, the logic array may be personalized upon the selective application of current in these control loops. As a further alternative, bubble memories or the output of other logic circuits can be utilized to personalize the array. By providing streams of data inputs at propagation paths 151 and 152 and streams of control inputs to the control paths 103 through 106 the logic array is universal and amenable to pipelining operations wherein the personalization of the array may vary with the different sets of input data. Furthermore, since the logic implementation does not depend on counting and the personalization may be varied on each bit cycle a meaningful output may be obtained on each bit cycle.

We claim:
1. A bubble logic array for performing a logic function on a set of input data in the form of a bubble domain pattern and producing a logical output responsive thereto, also in the form of a bubble domain pattern, said logic array comprising,
   a data input bubble propagation path including n input paths for accepting n bubble inputs comprising data,
   a bubble decoder means with an input and an output, means connecting said data input to said decoder means input, said decoder means output including $2^n$ decoder output paths, each of said decoder output paths providing one of the possible $2^n$ combinations of said input data in the form of said bubble domain pattern,
   bubble logic means connected to each of said decoder output paths including a plurality of AND gates, each with at least two inputs and an output, one AND gate input receiving data from each of said decoder output paths,
   an OR gate with $2^n$ inputs, one input connected to each of said AND gate outputs, a plurality of $2^n$ bubble control inputs, each connected to a different one of said other inputs of said AND gates, said plurality of control inputs defining the logic function performed by said array by said bubble domain pattern.

2. The array of claim 1 wherein bubble delay means are included in said decoder means output paths.

3. The array of claim 1 in which $2^n - 1$ bubble delay means are included, each of said bubble delay means included, one in each $2^n - 1$ decoder means output paths.

4. The array of claim 3 in which a bubble delay means is included in said data input path.

5. The array of claim 1 in which selective ones of said control input paths are connected to bubble generators.

6. The array of claim 1 in which each of said control input paths are connected to bubble generators and control means for each of said generators is arranged to selectively inhibit bubbles from said generators.

7. The array of claim 1 in which control input paths are connected to different control bubble propagation paths.

8. A bubble logic array having a bubble input and a bubble output and a plurality of bubble control paths for performing a logic function on a set of input data presented to said input in the form of the presence and absence of bubbles comprising, bubble decoder means connected to said data input and having a plurality of output paths, each of said paths providing a different logical combination of input data, said bubble decoder means further having delay means to equalize the transit time from said input to each of said output paths, a plurality of logic means each connected to a different one of said output paths and controlled by a different one of said control paths for personalizing said array in response to the presence and absence of bubbles in said control path, and means connected to said output for combining the output of each of said logic means.

9. The array of claim 8 in which selective ones of said control paths are connected to bubble generators.

10. The array of claim 8 in which each of said control paths are connected to bubble generators, control means for each of said bubble generators for selectively allowing bubble generation in response to a signal in said control means.

11. The array of claim 8 in which each of said control paths is connected to a bubble register.

12. The array of claim 8 in which said data input includes at least two bubble propagation paths.

13. The array of claim 8 in which said delay means are connected in said bubble decoder means output paths.

14. The array of claim 13 in which said data input includes at least two bubble propagation paths, delay means in at least one of said two bubble propagation paths.

15. A bubble-bubble decoder with n bubble input means accepting input data in the form of bubbles and having $2^n$ bubble output means for producing, at a separate output each possible logical combination of said input data comprising:

a plurality of bubble logic gates, each with at least two bubble outputs, each of said logic gates producing one output representing an EXCLUSIVE OR function and one output representing and AND function, said logic gates connected to said input means and said output means and to each other in a matrix, $2^n$ bubble generators each of said bubble generators connected to one input of $2^n$ logic gates, each AND output of each logic gate which is connected to a bubble generator connected to one input of a logic gate not connected to a bubble generator, each of said $2^n$ bubble output means connected to a different AND output of each logic gate not connected to a bubble generator.

16. A bubble logic array capable of pipelined operation having a bubble input and a bubble output for performing a logic function on plurality of sets of input data serially presented to said input in the form of a bubble pattern comprising, bubble decoder means connected to said input and having a plurality of output paths, each of said paths serially providing a different logical combination of each of said sets of input data, said bubble decoder means further having delay means to equalize the transit time from said input to each of said output paths, a plurality of logic means each connected to a different one of said output paths for personalizing said array, and means connecting an output of each of said logic means to said output.

17. The array of claim 16 in which only certain of said logic means are connected to a personalization bubble input.

18. The array of claim 16 in which each of said logic means is connected to a personalization bubble path and which further includes control means to personalize said array by selectively allowing selective ones of said personalization bubble paths to transmit a bubble.

19. A bubble logic array having a bubble input and a bubble output and a plurality of control paths for performing a logic function on a set of input data presented to said input in the form of a coded pattern of bubbles comprising, bubble decoder means connected to said input and having a plurality of output paths, each of said paths providing a different logical combination of said input data, said bubble decoder means further having delay means to equalize the transit time from said input to each of said output paths, a plurality of logic means each connected to a different one of said output paths and controlled by a different one of said control paths for personalizing said array in response to signals on said control paths, and means connected to said output for combining the output of each of said logic means.

20. The apparatus of claim 19 in which said control paths are bubble propagation paths and said signals on said control paths are in the form of the presence or absence of bubbles.

21. The array of claim 20 in which selective ones of said bubble control paths are connected to bubble generators.

22. The array of claim 20 in which each of said bubble control paths are connected to bubble generators, control means for each of said bubble generators for selectively allowing bubble generation in response to a signal in said control means.

23. The array of claim 20 in which each of said bubble control paths is connected to a bubble register.

24. The array of claim 19 where said pattern of bubbles is coded in accordance with the presence and absence of bubbles.

* * * * *

UNITED STATES PATENT AND TRADEMARK OFFICE
CERTIFICATE OF CORRECTION

PATENT NO. : 4,011,461
DATED : March 8, 1977
INVENTOR(S) : Hsu Chang et al

It is certified that error appears in the above-identified patent and that said Letters Patent are hereby corrected as shown below:

In column 4, line 18, please correct the formula to read:

-- $f(x_1, x_2, \ldots, x_n) = a_0 \bar{x}_1 \bar{x}_2 \ldots \bar{x}_n + a_1 x_1 \bar{x}_2 \ldots \bar{x}_n + \ldots a_{2^n - 1} x_1 x_2 \ldots x_n$ --

In line 20, correct the formula as follows:

-- (1) $a_0 = f(0, 0, \ldots 0)$, $a_{2^n - 1} = f(1, 1, \ldots 1)$ --

On line 24, correct the formula as follows:

-- $(a_0, a_1 \ldots a_{2^n - 1})$ --

Signed and Sealed this nineteenth Day of July 1977

[SEAL]

Attest:

RUTH C. MASON
*Attesting Officer*

C. MARSHALL DANN
*Commissioner of Patents and Trademarks*